United States Patent
Jeon et al.

(10) Patent No.: US 11,069,418 B1
(45) Date of Patent: Jul. 20, 2021

(54) METHOD AND SYSTEM FOR OFFLINE PROGRAM/ERASE COUNT ESTIMATION

(71) Applicant: EMC IP Holding Company LLC, Hopkinton, MA (US)

(72) Inventors: Seungjune Jeon, Santa Clara, CA (US); Haleh Tabrizi, San Francisco, CA (US); Andrew Cullen, Midleton (IE)

(73) Assignee: EMC IP Holding Company LLC, Hopkinton, MA (US)

( * ) Notice: Subject to any disclaimer, the term of this patent is extended or adjusted under 35 U.S.C. 154(b) by 667 days.

(21) Appl. No.: 15/395,050

(22) Filed: Dec. 30, 2016

(51) Int. Cl.
  *G06F 11/00* (2006.01)
  *G11C 16/34* (2006.01)
  *G06F 11/10* (2006.01)
  *G11C 29/52* (2006.01)
  *G06F 3/06* (2006.01)

(52) U.S. Cl.
  CPC ........ *G11C 16/3495* (2013.01); *G06F 3/0619* (2013.01); *G06F 3/0652* (2013.01); *G06F 3/0659* (2013.01); *G06F 3/0679* (2013.01); *G06F 11/1068* (2013.01); *G11C 29/52* (2013.01)

(58) Field of Classification Search
  None
  See application file for complete search history.

(56) References Cited

U.S. PATENT DOCUMENTS

| | | | |
|---|---|---|---|
| 6,016,275 A | 1/2000 | Han | |
| 6,862,675 B1 | 3/2005 | Wakimoto | |
| 7,559,004 B1 * | 7/2009 | Chang | H03M 13/09 714/708 |
| 8,189,379 B2 | 5/2012 | Camp et al. | |
| 8,259,506 B1 | 9/2012 | Sommer et al. | |

(Continued)

FOREIGN PATENT DOCUMENTS

| CN | 102150140 A | 8/2011 |
|---|---|---|
| CN | 103902234 A | 7/2014 |

(Continued)

OTHER PUBLICATIONS

Hyojin Choi et al.; "VLSI Implementation of BCH Error Correction for Multilevel Cell NAND Flash Memory"; IEEE Transactions on Very Large Scale Integration (VLSI) Systems; vol. 18, No. 5; pp. 843-847; May 2010 (5 pages).

(Continued)

*Primary Examiner* — Mujtaba M Chaudry
(74) *Attorney, Agent, or Firm* — Chamberlain, Hrdlicka, White, Williams & Aughtry (57) ABSTRACT

In general, embodiments of the technology relate to a method for characterizing persistent storage. The method includes selecting a sample set of physical addresses in a solid state memory module, where the sample set of physical addresses is associated with a region in the solid state memory module (SSMM). The method further includes issuing a write request to the sample set of physical addresses, after issuing the write request, issuing a request read to the sample set of physical addresses to obtain a copy of the data stored in the sample set of physical addresses, obtaining an error parameter for the copy of the data, determining a calculated P/E cycle value for the SSMM using at least the error parameter; and storing the calculated P/E cycle value in the SSMM.

14 Claims, 5 Drawing Sheets

(56) References Cited

U.S. PATENT DOCUMENTS

| | | | |
|---|---|---|---|
| 8,305,812 B2 * | 11/2012 | Levy .................. | G06F 11/1048 365/185.19 |
| 8,335,893 B2 | 12/2012 | Tagawa | |
| 8,694,724 B1 | 4/2014 | Linnell et al. | |
| 8,819,503 B2 * | 8/2014 | Melik-Martirosian | ..................... G06F 11/3034 714/704 |
| 8,868,842 B2 | 10/2014 | Yano et al. | |
| 8,891,303 B1 | 11/2014 | Higgins et al. | |
| 8,934,284 B2 | 1/2015 | Patapoutian et al. | |
| 8,995,197 B1 | 3/2015 | Steiner et al. | |
| 9,026,764 B2 | 5/2015 | Hashimoto | |
| 9,195,586 B2 * | 11/2015 | Cometti ............. | G06F 12/0246 |
| 9,330,767 B1 | 5/2016 | Steiner et al. | |
| 9,368,225 B1 | 6/2016 | Pinkovich et al. | |
| 9,496,043 B1 | 11/2016 | Camp et al. | |
| 9,564,233 B1 | 2/2017 | Cho | |
| 9,606,737 B2 | 3/2017 | Kankani et al. | |
| 9,645,177 B2 | 5/2017 | Cohen et al. | |
| 9,690,655 B2 | 6/2017 | Tabrizi et al. | |
| 9,710,180 B1 | 7/2017 | Van Gaasbeck | |
| 9,740,425 B2 | 8/2017 | Bakshi et al. | |
| 9,798,334 B1 | 10/2017 | Tabrizi et al. | |
| 9,842,060 B1 | 12/2017 | Jannyavula Venkata et al. | |
| 9,864,525 B2 | 1/2018 | Kankani et al. | |
| 9,891,844 B2 | 2/2018 | Kankani et al. | |
| 9,905,289 B1 | 2/2018 | Jeon et al. | |
| 2005/0172082 A1 | 8/2005 | Liu et al. | |
| 2005/0223185 A1 | 10/2005 | Lee | |
| 2005/0278486 A1 | 12/2005 | Trika et al. | |
| 2007/0260811 A1 | 11/2007 | Merry, Jr. et al. | |
| 2007/0263444 A1 | 11/2007 | Gorobets et al. | |
| 2007/0266200 A1 | 11/2007 | Gorobets et al. | |
| 2008/0082725 A1 | 4/2008 | Elhamias | |
| 2008/0082726 A1 | 4/2008 | Elhamias | |
| 2009/0144598 A1 * | 6/2009 | Yoon .................. | G06F 11/1048 714/752 |
| 2010/0306577 A1 | 12/2010 | Dreifus et al. | |
| 2010/0306580 A1 | 12/2010 | McKean et al. | |
| 2010/0332923 A1 * | 12/2010 | D'Abreu ............. | G06F 11/1068 714/708 |
| 2011/0173484 A1 * | 7/2011 | Schuette ............. | G06F 11/0727 714/2 |
| 2011/0202818 A1 * | 8/2011 | Yoon .................. | G06F 11/1068 714/773 |
| 2012/0110239 A1 | 5/2012 | Goss et al. | |
| 2012/0192035 A1 * | 7/2012 | Nakanishi ........... | G06F 11/1048 714/766 |
| 2012/0224425 A1 | 9/2012 | Fai | |
| 2012/0236656 A1 | 9/2012 | Cometti | |
| 2012/0239991 A1 | 9/2012 | Melik-Martirosian | |
| 2012/0268994 A1 | 10/2012 | Nagashima | |
| 2012/0290899 A1 * | 11/2012 | Cideciyan .......... | G06F 11/1072 714/773 |
| 2013/0019057 A1 | 1/2013 | Stephens | |
| 2013/0047044 A1 | 2/2013 | Weathers et al. | |
| 2013/0094286 A1 | 4/2013 | Sridharan et al. | |
| 2013/0151214 A1 | 6/2013 | Ryou | |
| 2013/0176784 A1 | 7/2013 | Cometti et al. | |
| 2013/0185487 A1 | 7/2013 | Kim et al. | |
| 2013/0227200 A1 | 8/2013 | Cometti et al. | |
| 2013/0311712 A1 | 11/2013 | Aso | |
| 2014/0006688 A1 | 1/2014 | Yu et al. | |
| 2014/0101499 A1 | 4/2014 | Griffin | |
| 2014/0181378 A1 | 6/2014 | Saeki et al. | |
| 2014/0181595 A1 | 6/2014 | Hoang et al. | |
| 2014/0195725 A1 | 7/2014 | Bennett | |
| 2014/0208174 A1 | 7/2014 | Ellis et al. | |
| 2014/0215129 A1 | 7/2014 | Kuzmin et al. | |
| 2014/0229799 A1 * | 8/2014 | Hubris ................ | H04L 1/0009 714/773 |
| 2014/0293699 A1 | 10/2014 | Yang et al. | |
| 2014/0347936 A1 | 11/2014 | Ghaly | |
| 2014/0359202 A1 | 12/2014 | Sun et al. | |
| 2014/0365836 A1 | 12/2014 | Jeon et al. | |
| 2015/0078094 A1 | 3/2015 | Nagashima | |
| 2015/0082121 A1 | 3/2015 | Wu et al. | |
| 2015/0205664 A1 | 7/2015 | Janik | |
| 2015/0227418 A1 | 8/2015 | Cai et al. | |
| 2015/0357045 A1 | 12/2015 | Moschiano et al. | |
| 2016/0004464 A1 | 1/2016 | Shen | |
| 2016/0092304 A1 | 3/2016 | Tabrizi | |
| 2016/0093397 A1 | 3/2016 | Tabrizi | |
| 2016/0148708 A1 | 5/2016 | Tuers et al. | |
| 2016/0306591 A1 * | 10/2016 | Ellis .................... | G06F 3/0653 |
| 2016/0342345 A1 | 11/2016 | Kankani et al. | |
| 2017/0090783 A1 | 3/2017 | Fukutomi et al. | |
| 2017/0109040 A1 * | 4/2017 | Raghu ................ | G06F 3/061 |
| 2017/0117032 A1 | 4/2017 | Takizawa | |
| 2017/0228180 A1 | 8/2017 | Shen | |
| 2017/0235486 A1 | 8/2017 | Martineau et al. | |
| 2017/0262336 A1 | 9/2017 | Tabrizi et al. | |
| 2017/0315753 A1 | 11/2017 | Blount | |
| 2018/0018269 A1 | 1/2018 | Jannyavula Venkata et al. | |
| 2018/0032439 A1 | 2/2018 | Jenne et al. | |
| 2018/0034476 A1 | 2/2018 | Kayser et al. | |
| 2018/0039795 A1 | 2/2018 | Gulati | |
| 2018/0060230 A1 | 3/2018 | Kankani et al. | |

FOREIGN PATENT DOCUMENTS

| | | |
|---|---|---|
| JP | 2012-203957 A | 10/2012 |
| JP | 2013176784 A | 9/2013 |

OTHER PUBLICATIONS

Te-Hsuan Chen et al.; "An Adaptive-Rate Error Correction Scheme for NAND Flash Memory"; 27th IEEE VLSI Test Symposium; pp. 53-58; 2009 (6 pages).

Eran Gal et al.; "Algorithms and Data Structures for Flash Memories"; ACM Computing Surveys (CSUR); vol. 37, No. 2; pp. 138-163; Jun. 2005 (30 pages).

Mendel Rosenblum et al.; "The Design and Implementation of a Log-Structured File System"; ACM Transactions on Computer Systems; vol. 10; No. 1; pp. 26-52; Feb. 1992 (27 pages).

Chanik Park et al.; "A Reconfigurable FTL (Flash Translation Layer) Architecture for NAND Flash-Based Applications"; ACM Transactions on Embedded Computing Systems; vol. 7, No. 4, Article 38; Jul. 2008 (23 pages).

Yu Cai et al.; "Flash Correct-and-Refresh: Retention-Aware Error Management for Increased Flash Memory Lifetime"; Proceedings of the IEEE International Conference on Computer Design (ICCD); pp. 94-101; 2012 (10 pages).

Beomkyu Shin et al.; "Error Control Coding and Signal Processing for Flash Memories"; IEEE International Symposium on Circuits and Systems (ISCAS); pp. 409-412; 2012 (4 pages).

Haleh Tabrizi et al.; "A Learning-based Network Selection Method in Heterogeneous Wireless Systems"; IEEE Global Telecommunications Conference (GLOBECOM 2011); 2011 (5 pages).

Neal Mielke et al.; "Recovery Effects in the Distributed Cycling of Flash Memories"; IEEE 44th Annual International Reliability Physics Symposium; pp. 29-35; 2006 (7 pages).

Ramesh Pyndiah et al.; "Near Optimum Decoding of Product Codes"; Global Telecommunicaitons Conference (GLOBECOM '94), Communications: The Global Bridge pp. 339-343; 1994 (5 pages).

Junsheng Han et al.; "Reliable Memories with Subline Accesses"; International Symposium on Information Theory (ISIT); pp. 2531-2535, Jun. 2007 (5 pages).

Ankit Singh Rawat et al.; "Locality and Availability in Distributed Storage," arXiv:1402.2011v1 [cs.IT]; Feb. 10, 2014 (9 pages).

Parikshit Gopalan et al.; "On the Locality of Codeword Symbols"; arXiv:1106.3625v1[cs.IT]; Jun. 18, 2011 (17 pages).

Frédérique Oggier et al.; "Self-repairing Homomorphic Codes for Distributed Storage Systems"; IEEE INFOCOM 2011; pp. 1215-1223; 2011 (9 pages).

Dimitris Papailiopoulos et al.; "Simple Regenerating Codes: Network Coding for Cloud Storage"; arXiv:1109.0264v1 [cs.IT]; Sep. 1, 2011 (9 pages).

(56) References Cited

OTHER PUBLICATIONS

Osama Khan et al.; "In Search of I/O-Optimal Recovery from Disk Failures"; HotStorage 2011; Jun. 2011 (5 pages).
Cheng Huang et al.; "Pyramid Codes: Flexible Schemes to Trade Space for Access Efficiency in Reliable Data Storage Systems"; Sixth IEEE International Symposium on Network Computing and Applications (NCA); 2007 (8 pages).
Hongchao Zhou et al.; "Error-Correcting Schemes with Dynamic Thresholds in Nonvolatile Memories"; 2011 IEEE International Symposium on Information Theory Proceedings; pp. 2143-2147; 2011; (5 pages).
Borja Peleato et al.; "Towards Minimizing Read Time for NAND Flash"; Globecom 2012—Symposium on Selected Areas in Communication; pp. 3219-3224; 2012 (6 pages).
Yongjune Kim et al.; "Modulation Coding for Flash Memories"; 2013 International Conference on Computing, Networking and Communications, Data Storage Technology and Applications Symposium; pp. 961-967; 2013 (7 pages).
Yu Cai et al.; "Program Interference in MLC NAND Flash Memory: Characterization, Modeling, and Mitigation"; 2013 IEEE International Conference on Computer Design (ICCD); pp. 123-130; 2013 (8 pages).
Yu Cai et al.; "Threshold Voltage Distribution in MLC NAND Flash Memory: Characterization, Analysis, and Modeling"; Proceedings of the Conference on Design, Automation and Test in Europe; pp. 1285-1290; 2013 (6 pages).
Eitan Yaakobi et al.; Error Characterization and Coding Schemes for Flash Memories; IEEE Globecom 2010 Workshop on Application of Communication Theory to Emerging Memory Technologies; pp. 1856-1860; 2010 (5 pages).
Borja Peleato et al.; "Maximizing MLC NAND lifetime and reliability in the presence of write noise"; IEEE International Conference on Communications (ICC); pp. 3752-3756; 2012 (5 pages).
Feng Chen et al.; "Essential Roles of Exploiting Internal Parallelism of Flash Memory based Solid State Drives in High-Speed Data Processing"; 2011 IEEE 17th International Symposium on High Performance Computer Architecture (HPCA); pp. 266-277; 2011.

\* cited by examiner

METHOD AND SYSTEM FOR OFFLINE PROGRAM/ERASE COUNT ESTIMATION

BACKGROUND

Solid state storage generally corresponds to any type of storage that has a finite number of program-erase cycles. The limited number of program-erase cycles or write cycles necessitates the use of methods to avoid excessive writes to the same region of the solid state storage in order to prevent data loss. In order to maximize the use of the solid state storage, storage systems using solid state storage include mechanisms to track the number of program-erase cycles performed on the various regions of the solid state storage. Meanwhile, the characteristics of storage elements change as program-erase cycles increase so that the optimality of various parameters for storage elements depends on the program-erase cycles information available in the solid-state storage system. The sub optimality of storage element parameters due to any absence or inaccuracy of program-erase cycles information may result in increased latency, decreased throughput, or data loss.

DETAILED DESCRIPTION

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description In the following description of FIGS. 1-6, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology relate to determining a P/E cycle value for an offline storage module. More specifically, embodiments of the technology relate to scenarios in which the P/E cycle value for a storage module is unknown and/or needs to be verified. For example, consider a scenario in which a user removes a storage module from an operating storage appliance and returns the storage module to a vendor or other entity. The vendor (or other entity) may need to determine whether the storage module has reached its end of life (EOL) or if the storage module may be used in another storage appliance. In order to make this determination, embodiments of the technology include a testing system and method for determining and/or verifying the current P/E cycle value of such a storage module.

The following description describes one or more systems and methods for implementing one or more embodiments of the technology.

Figure 1:
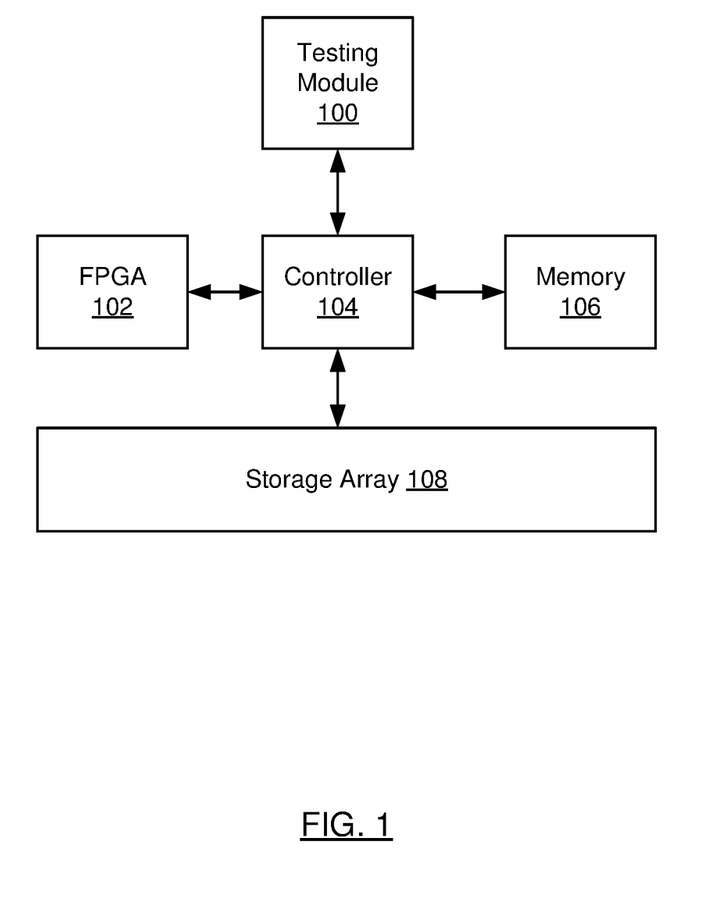
FIG. 1 show systems in accordance with one or more embodiments of the technology.

FIG. 1 shows a system in accordance with one embodiment of the technology. As shown in FIG. 1, the system includes a testing module (100), a controller (104), memory (106), optionally a Field Programmable Gate Array (FPGA) (102), and a storage array (108). Each of these components is described below.

Figure 5:
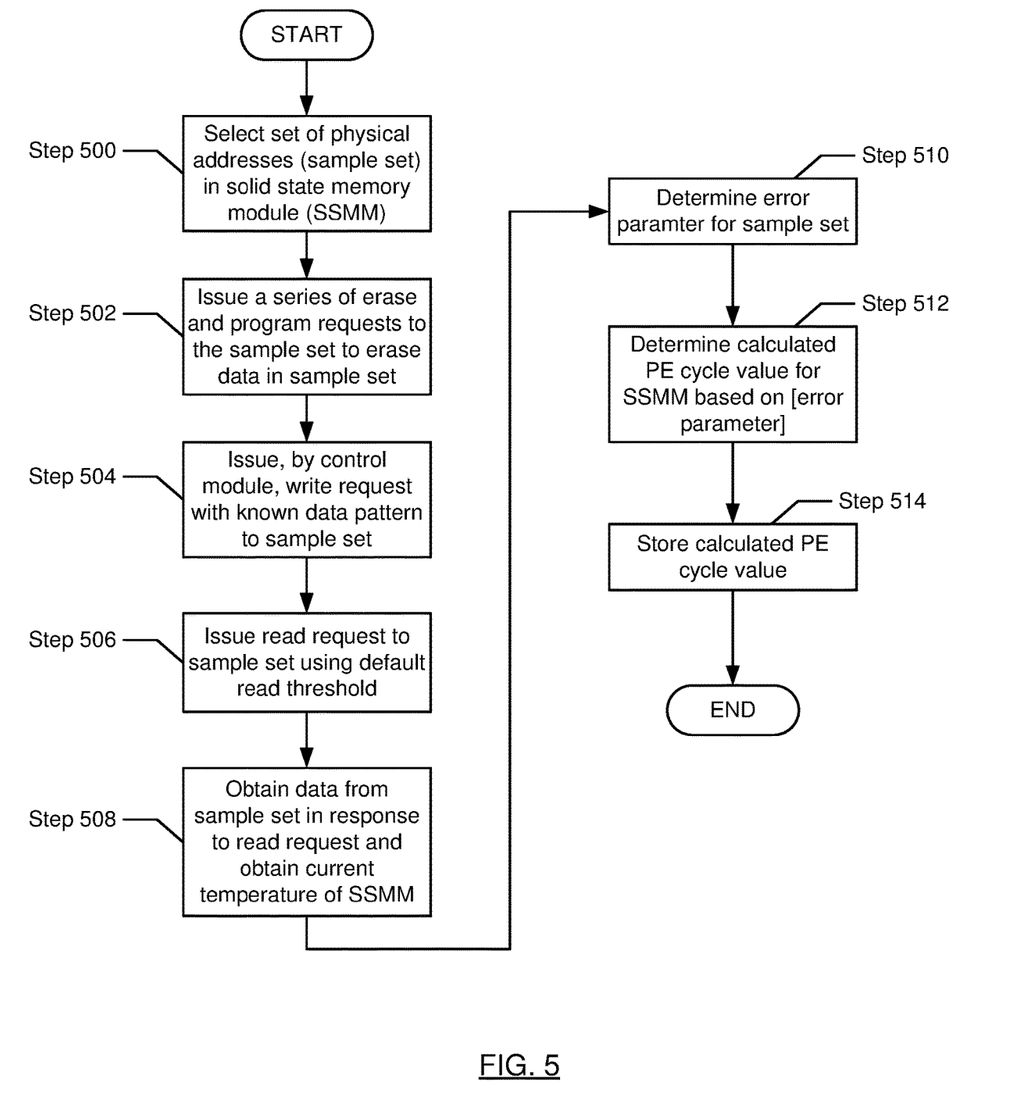
FIG. 5 shows a method for method for estimating a Program/Erase (P/E) cycle value for an online storage module in accordance with one or more embodiments of the technology.

In one embodiment of the technology, a testing module (100) is any system or process executing on a system that includes functionality to issue a read request or a write request to the controller (104) in order to initiate the method described in FIG. 5. In one embodiment of the technology, the testing module (100) may each include a processor (not shown), memory (not shown), and persistent storage (not shown).

In another embodiment of the technology, the testing module is user interface that is provided by the controller (104). In such cases, the testing module may be command line interface or a graphical user interface that is provided by the controller (104). In these scenarios, the testing module may be implemented as module within the controller instead of being implemented on a physical system that is separate from the controller as shown in FIG. 1.

Continuing with the discussion of FIG. 1, the controller includes functionality to implement the method described in FIG. 5. For example, the controller includes functionality to write data to and read data from the storage array (108). In one embodiment of the technology, the controller (104) includes a processor configured to execute instructions to implement one or more embodiments of the technology, where the instructions are stored on a non-transitory computer readable medium (not shown) that is located within or that is operatively connected to the controller (104). Alternatively, the controller (104) may be implemented using hardware. Those skilled in the art will appreciate that the controller (104) may be implemented using any combination of software and/or hardware without departing from the technology.

In one embodiment of the technology, the controller (104) is operatively connected to memory (106). The memory (106) may be any volatile memory including, but not limited to, Dynamic Random-Access Memory (DRAM), Synchronous DRAM, SDR SDRAM, and DDR SDRAM. In one embodiment of the technology, the memory (106) is configured to temporarily store various data prior to such data being stored in the storage array.

In one embodiment of the technology, the FPGA (102) (if present) may be used to offload all or a portion of the functionality of the controller (104) in accordance with one or more embodiments of the technology.

In one embodiment of the technology, the storage array (108) includes one or more storage modules (SMs). Additional detail about the storage modules is provided with respect to FIGS. 2-3. Those skilled in the art will appreciate that while FIG. 1 shows an FPGA, the technology may be implemented without an FPGA. Further, those skilled in the art will appreciate that other components may be used in place of the FPGA without departing from the technology. For example, the technology may be implemented using an Application Specific Integrated Circuit(s) (ASIC), a graphics processing unit(s) (GPU), a general purpose processor(s), any other hardware device capable of offloading all or a portion of the processing performed by the controller.

Those skilled in the art will appreciate that the technology is not limited to the configuration shown in FIG. 1.

Figure 2:
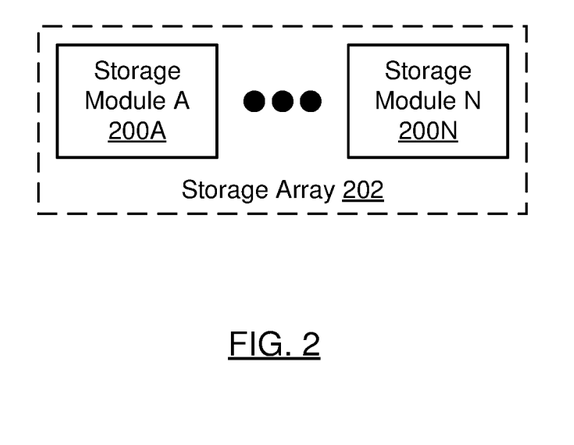
FIG. 2 shows storage appliances in accordance with one or more embodiments of the technology.

FIG. 2 shows a storage array in accordance with one or more embodiments of the technology. In one embodiment of the technology, the storage array (202) includes one or more storage modules (200A, 200N) each configured to store data. At least one of the storage modules in the storage array is an uncharacterized storage module. A storage module may be deemed an uncharacterized storage module if the P/E cycle value of the storage module is unknown or the storage module includes a P/E cycle value, which has not been verified in accordance with the method shown in FIG. 5. One embodiment of a storage module is described below in FIG. 3.

Figure 3:
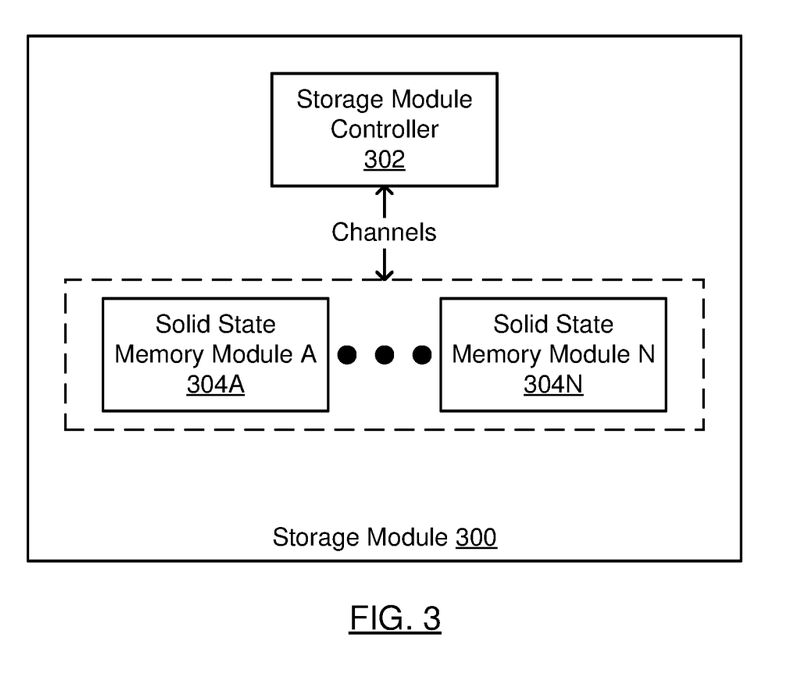
FIG. 3 shows a storage module in accordance with one or more embodiments of the technology.

FIG. 3 shows a storage module in accordance with one or more embodiments of the technology. The storage module (300) includes a storage module controller (302), memory (not shown), and one or more solid-state memory modules (304A, 304N). Each of these components is described below.

In one embodiment of the technology, the storage module controller (300) is configured to receive requests read and/or write requests from the controller. Further, the storage module controller (300) is configured to service the read and write requests using the memory (not shown) and/or the solid-state memory modules (304A, 304N).

In one embodiment of the technology, the memory (not shown) corresponds to any volatile memory including, but not limited to, Dynamic Random-Access Memory (DRAM), Synchronous DRAM, SDR SDRAM, and DDR SDRAM.

In one embodiment of the technology, the solid-state memory modules (304A, 304N) correspond to any data storage device that uses solid-state memory to store persistent data. The solid-state memory may include, but is not limited to, Spin-Torque Magnetic RAM (ST-MRAM), Phase Change Memory (PCM), write in-place persistent storage, NAND Flash memory and NOR Flash memory. Further, the NAND Flash memory and the NOR flash memory may include single-level cells (SLCs), multi-level cell (MLCs), or triple-level cells (TLCs). Generally, the solid-state memory may correspond to any type of memory that has a finite number of program-erase cycles. Those skilled in the art will appreciate that embodiments of the technology are not limited to storage class memory.

Figure 4:
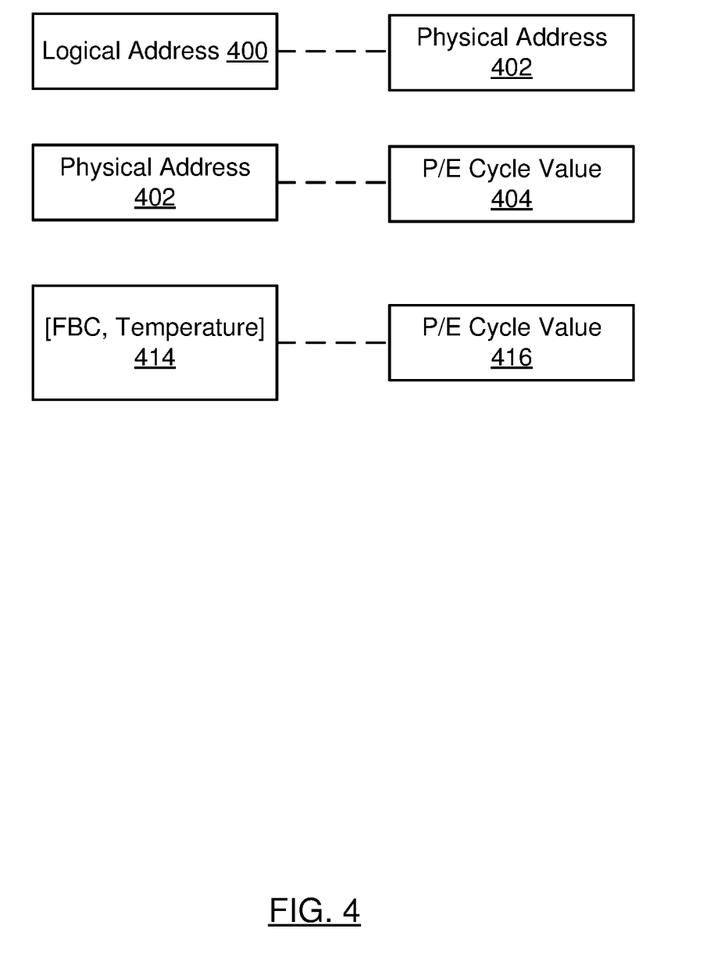
FIG. 4 shows the relationship between various components in accordance with one or more embodiments of the technology.

FIG. 4 shows the relationship between various components in accordance with one or more embodiments of the technology. More specifically, FIG. 4 shows the various types of information that is stored in the memory of the controller. Further, the controller includes functionality to update the information stored in the memory of the controller. The information described below may be stored in one or more in-memory data structures. Further, any data structure type (e.g., arrays, linked lists, hash tables, etc.) may be used to organize the following information within the in-memory data structure(s) provided that the data structure type(s) maintains the relationships (as described below) between the information.

The memory includes a mapping of logical addresses (400) to physical addresses (402). In one embodiment of the technology, the logical address (400) is an address at which the data appears to reside from the perspective of the client (e.g., 100A, 100M in FIG. 1A). Said another way, the logical address (400) corresponds to the address that may be used by the testing module (or via the testing module) to identify the sample set (defined below).

In one embodiment of the technology, the logical address is (or includes) a hash value generated by applying a hash function (e.g., SHA-1, MD-5, etc.) to an n-tuple, where the n-tuple is <object ID, offset ID>. In one embodiment of the technology, the object ID defines a file and the offset ID defines a location relative to the starting address of the file. In another embodiment of the technology, the n-tuple is <object ID, offset ID, birth time>, where the birth time corresponds to the time when the file (identified using the object ID) was created. Alternatively, the logical address may include a logical object ID and a logical byte address, or a logical object ID and a logical address offset. In another embodiment of the technology, the logical address includes an object ID and an offset ID. Those skilled in the art will appreciate that multiple logical addresses may be mapped to a single physical address and that the logical address content and/or format is not limited to the above embodiments.

In one embodiment of the technology, the physical address (402) corresponds to a physical location in a solid-state memory module (304A, 304N) in FIG. 3. In one embodiment of the technology, the physical address is defined as the following n-tuple: <storage module, channel, chip enable, LUN (or die), plane, block, page number, byte>.

In one embodiment of the technology, after the method shown in FIG. 5, each physical address (402) is associated with a program/erase (P/E) cycle value (404). Alternatively, after the method shown in FIG. 5, the storage module (or a portion thereof) may be associated with a P/E cycle value instead of the P/E cycle value being associated with each individual physical address. The P/E cycle value may represent: (i) the number of P/E cycles that have been performed on the physical location defined by the physical address or (ii) a P/E cycle range (e.g., 5,000-9,999 P/E cycles), where the number of P/E cycles that have been performed on the physical location defined by the physical address is within the P/E cycle range. In one embodiment of the technology, a P/E cycle is the writing of data to one or more pages in an erase block (i.e., the smallest addressable unit for erase operations, typically, a set of multiple pages) and the erasure of that block, in either order.

The P/E cycle values may be stored on a per page basis, a per block basis, on a per set of blocks basis, and/or at any other level of granularity.

In one embodiment of the technology, the in-memory data structure includes a mapping of <failed bit count (FBC), temperature> to P/E cycle value (416). The FBC may represent the number of bits that are incorrect in data, typically in an Error Correcting Code (ECC) codeword (also referred to as a codeword), that is read from the storage module. The FBC may be obtained as output of an ECC decoder (located in the storage module controller) when the ECC decoding operation is successful. The mean FBC may be calculated over a sample of ECC codewords. In one embodiment, the mean FBC is obtained as the mean of FBCs from all the pages of a block or a group of blocks whose P/E cycles is to be estimated. Without departing from the technology, other sampling and averaging methods may be used. In one embodiment, mean FBC may be represented as a specific value or as a range. In one embodiment, the aforementioned mapping may not include temperature. For example, the mapping may be a mapping between <FBC> and <P/E cycle value>. While the above mapping uses mean FBC, other measures of error rate for data read from the storage modules may be used without departing from the technology.

In one embodiment of the technology, in place of FBC, a syndrome weight from LDPC (low-density parity-check) decoder output may be used. Syndrome weight is the number of failed parity check equations during the ECC decoding. Syndrome weight of ECCs with sparse parity check matrices such as LDPC codes may be used in place of FBC. In one embodiment of the technology, in place of FBC, decoding latency may be used. In ECC decoders such as BCH (Bose-Chaudhury-Hocquenghem) decoder or LDPC decoder, the decoding latency increases as FBC corrected by the decoder increases.

In one embodiment of the technology, the <FBC, Temperature> to <PIE cycle value> mappings are ascertained by conducting experiments to determine the FBC for specific combinations of temperature and known P/E cycle values. For example, data, with a known pattern, may be read from a solid-state memory module with a known P/E cycle value at a particular temperature. The resulting FBC from the read data may then be used to generate the <FBC, Temperature> to P/E cycle value mapping. A similar method may be used to determine <FBC> to <P/E cycle value> mappings without departing from the technology. For example, if the method shown in FIG. 5 is always performed at a specific temperature, then the in-memory data structure may only include an <FBC> to <P/E cycle value> mapping for a single temperature.

In one embodiment of the technology, the FBC, syndrome weight, and decoding latency may be each individually referred to as an as error parameter and collectively as error parameters. Accordingly, the <FBC> to <P/E cycle value> mapping and the <FBC, temperature> to <P/E cycle value> mapping may be represented as an <error parameter> to <P/E cycle value> mapping or an <error parameter, temperature> to <P/E cycle value> mapping, respectively, without departing from the technology.

Turning to the flowcharts, while the various Steps in the flowchart are presented and described sequentially, one of ordinary skill will appreciate that some or all of the steps may be executed in different orders, may be combined or omitted, and some or all of the steps may be executed in parallel.

FIG. 5 shows a method for estimating a P/E cycle value for an offline storage module in accordance with one or more embodiments of the technology. The method shown in FIG. 5 may be performed by the controller. Further, the method shown in FIG. 5 may be performed when an uncharacterized storage module in connected (directly or indirectly) to the controller and/or may be performed upon request by a user of the storage application or a third-party, or may be performed any other time.

Turning to FIG. 5, in step 500, a set of physical addresses (sample set) in a solid state memory module (SSMM) is selected. The set of physical addresses may correspond to physical addresses within the region of the SSMM for which the P/E cycle value needs to be calculated. If the P/E cycle value is to be calculated for the entire SSMM, then the sample set may correspond to a representative set of physical addresses across the SSMM. The sample set may correspond to a set of contiguous or non-contiguous physical addresses.

The selection of the sample set may be performed by a user via the testing module. For example, the user may, via the testing module, specify that the method in FIG. 5 is to be performed and as part of this request specify a logical address or set of logical addresses. The controller may then convert the logical address(es) into a corresponding physical address(es). In another embodiment, the sample set may be pre-configured in the controller. For example, a particular block on each solid state memory module or a particular set of blocks on each solid state memory module may be selected.

The sample set may be selected such that the resulting calculated P/E value accurately reflects the P/E cycle value of the entire solid state memory module or accurately reflects the P/E cycle value of a specific portion of the solid state memory module.

In step 502, the sample set is erased. More specifically, the controller may issue multiple consecutive erase and write requests to the sample set. In one embodiment of the technology, the idle time between each erase and write request is predefined to match the characterization condition under which the <error parameter> to <P/E cycle value> mapping (or the <error parameter, temperature> to <P/E cycle value> mapping) is determined. For example, 10 s, 100 s, or 1000 s of seconds may be used. The data pattern to program may change at each write request. For example, 10 or 100 consecutive erase and write requests could be performed with 10 or 100 different data patterns being written, respectively. In one embodiment, one or more of the data patterns may be generated by a random number generator. The last write request performed in step 502 is an erase request, so that the sample set is ready to program in the next step.

In step 504, the controller generates and issues a write request with a known data pattern to the sample set in order to program the sample set. The result of step 504 is the writing of the data with a known data pattern to the sample set. In one embodiment, writing the data to the solid-state memory module may include generating an ECC codeword that includes the data (i.e., the data to written) and parity bits obtained using, e.g., a code generator matrix. The codeword is subsequently stored in the sample set.

In step 506, the controller subsequently generates and issues a read request to the sample set.

In step 508, the controller subsequently receives a copy of the data that is currently written to the sample set. The controller also receives the current temperature reading of the SSMM(s) in which the sample set is located. The temperature may be obtained by issuing a separate request to the storage module controller that is operatively connected to the SSMM(s) in which the sample set is located. Alternatively, the current temperature reading may be included with the response to the read request. In one embodiment of the technology, step 508 may not be performed when the storage array (i.e., the storage array that includes the solid state memory module being tested) is in a temperature-controlled environment and the temperature of the storage array is constant (or substantially constant) and the temperature is known. For example, the method in FIG. 5 is performed when the solid state memory module is 40° C. The technology is not limited to the aforementioned temperature.

In step 510, the error parameter for the sample set is determined. In one embodiment, the FBC may be determined by comparing the data pattern of the data received in step 508 with the known data pattern of the data written to the sample set in step 504. The comparison may be performed, by the controller, on a per-bit basis in order to determine the number of bits that are different.

In another embodiment of the technology, the FBC may be determined by the ECC decoder (not shown) in the storage module controller, by performing error correction on the data received in step 508, where the result of the error correction includes the number of bit errors in the data received in step 508. In scenarios in which the ECC decoder is used, the data written to the sample set does not necessarily need to be data with a known data pattern. In one embodiment, a set of data with known data patterns may be written to the sample set. In such cases, the FBC may be determined on a per-physical address basis (i.e., per-physical address in the sample set) to obtain a set of FBCs. In another embodiment of the technology, the ECC decoder may obtain a set of FBCs based on the data that is stored in sample set. The FBC that results from step 510 may then be determined as the mean or median FBC generated from the set of FBCs. The FBC may be determined using other mechanisms without departing from the technology. Step 510 may alternatively involve obtaining the decoding latency instead of FBC.

In step 512, a calculated P/E cycle value is determined by performing a look-up in the in-memory data structure using the <error parameter, temperature> combination, where the error parameter is determined in step 510 and the temperature is obtained in step 508. In one embodiment of the technology, the error parameter determined in step 510 may be mapped to an error parameter range, where the error parameter range instead of the specific error parameter is used in the look-up performed in step 512. The result of step 512 is a calculated P/E cycle value.

In step 514, the calculated P/E cycle value is stored in the solid state memory module, e.g., in a known location and, optionally, the in-memory data structured is updated to include the calculated P/E cycle value as the P/E cycle value for all physical addresses in the same region as the sample set.

In one embodiment of the technology, the method shown in FIG. 5 may be performed for different sample sets on the same solid state memory module. In such cases, the calculated P/E cycle value for the solid state memory module is the average of the P/E cycle values obtained using the different sample sets in the solid state memory module. In another embodiment, if the variance of the resulting P/E cycle values between the sample sets exceeds a predefined threshold, then the controller may notify the user (via the testing module) that solid state memory module is not evenly worn and/or that there may be another issue with the solid state memory module.

Figure 6:
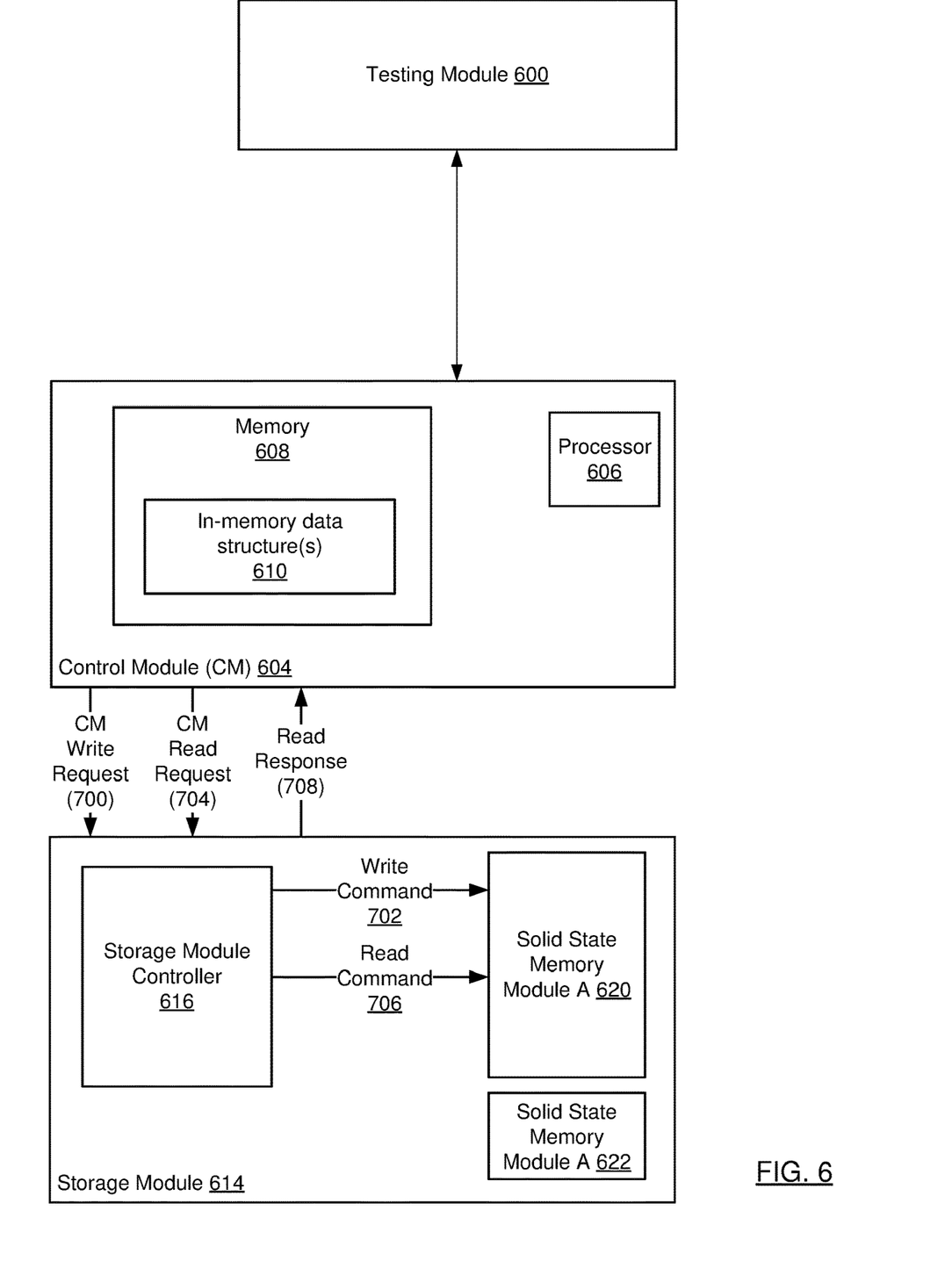
FIG. 6 shows an example in accordance with one or more embodiments of the technology.

FIG. 6 shows an example in accordance with one or more embodiments of the technology. The following example is not intended to limit the scope of the technology.

Turning to FIG. 6, consider a scenario in which the system includes a client (600) and a storage appliance. The storage appliance includes a controller (604) and a storage module (614). The controller includes a processor (606) and a memory (608) where the memory includes an in-memory data structure (610) (see e.g., FIG. 4).

In this example, assume that the controller receives a request from a testing module to perform the method in FIG. 5. Specifically, the controller generates and issues a controller write request (700) to a sample set of physical addresses in solid state memory module A (620). The storage module controller (616) in the storage module (614), in response to receiving the controller write request, issues a write command(s) (702) to solid state memory module A (620).

The controller then generates and issues a controller read request (704) to the sample set of physical addresses in solid state memory module A (620). The storage module controller (616) in the storage module (614), in response to receiving the controller read request, issues a write command(s) (706) to solid state memory module A (620).

The storage module controller (616), in response to the read request, obtains a copy of the data that is stored in the sample set from solid state memory module A (620) and the temperature value of solid state memory module A. The storage module controller (616) performs error correction on the obtained data using the ECC decoder (not shown) to obtain the FBC. The FBC along with the temperature value is subsequently provided to the controller (604) as part of a read response (708). The FBC in combination with the temperature value is then used to obtain P/E cycle value from the in-memory data structure (610). The calculated P/E cycle value is then stored in a specific location within solid state memory module A.

One or more embodiments of the technology may be implemented using instructions executed by one or more processors in the storage appliance. Further, such instructions may correspond to computer readable instructions that are stored on one or more non-transitory computer readable mediums.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A method for characterizing persistent storage, the method comprising:
   selecting a sample set of physical addresses in a solid state memory module (SSMM), wherein the sample set of physical addresses is associated with a region in the SSMM, wherein the selecting is initiated when a P/E cycle value for the SSMM is unknown;
   issuing a write request to the sample set of physical addresses;
   after issuing the write request, issuing a request read to the sample set of physical addresses to obtain a copy of the data stored in the sample set of physical addresses;
   obtaining an error parameter for the copy of the data;
   determining a calculated P/E cycle value for the SSMM using at least the error parameter; and
   storing the calculated P/E cycle value in the SSMM.

2. The method of claim 1, further comprising:
   after the selecting and prior to issuing the write request:
      issuing an erase request to erase all data from the sample set.

3. The method of claim 1, wherein the error parameter is a failed bit count (FBC).

4. The method of claim 3, wherein obtaining the error parameter comprises using a known data pattern of the data written to the SSMM in response to the write request.

5. The method of claim 1, wherein obtaining the error parameter comprises obtaining the error parameter from an error correcting code (ECC) decoder in a storage module controller, wherein the SSMM and the storage module controller are located in a storage module.

6. The method of claim 1, wherein the error parameter is a decoding latency.

7. The method of claim 1, wherein the SSMM is one of a plurality of SSMM in a storage module.

8. The method of claim 1, wherein the SSMM comprises NAND flash.

9. The method of claim 1, wherein the calculated P/E cycle value is a P/E cycle value range.

10. A non-transitory computer readable medium comprising computer readable program code, which when executed by a computer processor enables the computer processor to:
  select a sample set of physical addresses in a solid state memory module (SSMM), wherein the sample set of physical addresses is associated with a region in the SSMM, wherein the selecting is initiated when a P/E cycle value for the SSMM is unknown;
  issue a write request to the sample set of physical addresses;
  after issuing the write request, issue a request read to the sample set of physical addresses to obtain a copy of the data stored in the sample set of physical addresses;
  obtain an error parameter for the copy of the data;
  determine a calculated P/E cycle value for the SSMM using at least the error parameter; and
  store the calculated P/E cycle value in the SSMM.

11. The non-transitory computer readable medium of claim 10 further comprising computer readable program code, which when executed by the computer processor enables the computer processor to:
  after the selecting and prior to issuing the write request:
    issue an erase request to erase all data from the sample set.

12. The non-transitory computer readable medium of claim 10, wherein the error parameter is a failed bit count (FBC).

13. The non-transitory computer readable medium of claim 10, wherein obtaining the error parameter comprises obtaining the error parameter from an error correcting code (ECC) decoder in a storage module controller, wherein the SSMM and the storage module controller are located in the storage module.

14. The non-transitory computer readable medium of claim 10, wherein the error parameter is a decoding latency.

* * * * *